United States Patent
Tu et al.

(10) Patent No.: US 8,975,179 B2
(45) Date of Patent: Mar. 10, 2015

(54) PLANARIZATION PROCESS FOR SEMICONDUCTOR DEVICE FABRICATION

(75) Inventors: Che-Hao Tu, Hsinchu (TW); Weilun Hong, Hsinchu (TW); Ying-Tsung Chen, Hsinchu (TW); Liang-Guang Chen, Hsinchu (TW)

(73) Assignee: Taiwan Semiconductor Manufacturing Company, Ltd., Hsin-Chu (TW)

( * ) Notice: Subject to any disclaimer, the term of this patent is extended or adjusted under 35 U.S.C. 154(b) by 281 days.

(21) Appl. No.: 13/275,962

(22) Filed: Oct. 18, 2011

(65) Prior Publication Data

US 2013/0095644 A1  Apr. 18, 2013

(51) Int. Cl.
*H01L 21/4763* (2006.01)
*H01L 21/3105* (2006.01)
*H01L 29/66* (2006.01)
*H01L 21/28* (2006.01)
*H01L 29/51* (2006.01)

(52) U.S. Cl.
CPC .... *H01L 21/31053* (2013.01); *H01L 29/66545* (2013.01); *H01L 21/28079* (2013.01); *H01L 21/28088* (2013.01); *H01L 29/517* (2013.01)
USPC ...... 438/633; 438/622; 438/631; 257/E21.19; 257/E21.23

(58) Field of Classification Search
USPC ............ 438/585, 622, 631, 633; 257/E21.19, 257/E21.23
See application file for complete search history.

(56) References Cited

U.S. PATENT DOCUMENTS

| 6,933,226 B2* | 8/2005 | Lee et al. ............ 438/633 |
| 7,166,506 B2* | 1/2007 | Prince et al. ............ 438/243 |
| 7,923,321 B2 | 4/2011 | Lai et al. |
| 7,927,943 B2 | 4/2011 | Yeh et al. |
| 7,932,146 B2* | 4/2011 | Chen et al. ............ 438/238 |
| 7,981,801 B2 | 7/2011 | Chuang et al. |
| 7,985,690 B2 | 7/2011 | Thei et al. |
| 2002/0076867 A1* | 6/2002 | Lee et al. ............ 438/183 |
| 2006/0216935 A1* | 9/2006 | Oswald et al. ............ 438/691 |
| 2009/0047870 A1* | 2/2009 | Siddiqui et al. ............ 451/36 |
| 2009/0236669 A1* | 9/2009 | Chen et al. ............ 257/380 |
| 2010/0048007 A1* | 2/2010 | Lee et al. ............ 438/585 |
| 2010/0112732 A1* | 5/2010 | Lai et al. ............ 438/16 |
| 2011/0241117 A1* | 10/2011 | Wei et al. ............ 257/355 |

* cited by examiner

*Primary Examiner* — Lex Malsawma
*Assistant Examiner* — Eric Jones
(74) *Attorney, Agent, or Firm* — Haynes and Boone, LLP (57) ABSTRACT

The present disclosure provides a method of semiconductor fabrication including forming a dielectric layer is formed on and interposing a first feature and a second feature. A first CMP process is performed on the dielectric layer to removing the dielectric layer from a top surface of the first feature to expose an underlying layer and decreasing a thickness of the dielectric layer disposed on a top surface of the second feature such that a portion of the dielectric layer remains disposed on the top surface of the second feature. Thereafter, a second CMP process is performed which removes the dielectric layer remaining on the top surface of the second feature.

16 Claims, 9 Drawing Sheets

PLANARIZATION PROCESS FOR SEMICONDUCTOR DEVICE FABRICATION

BACKGROUND

The semiconductor integrated circuit (IC) industry has experienced rapid growth. In the course of IC evolution, functional density has generally increased while geometry size has decreased. While these evolution has allowed for increasing production efficiency and lowering associated costs, it has also raised challenges.

For example, in some IC designs it has become desirable conventional polysilicon gate electrode with a metal gate electrode to improve device performance. One process for forming a metal gate structure is referred to as a "gate last" process, where the metal gate structure is fabricated after a sacrificial gate structure is removed from the substrate. For example, in a gate last process, a dummy poly gate is initially formed and the device may continue with processing until deposition of an interlayer dielectric (ILD). The dummy poly gate may then be removed and replaced with a metal gate. This reduces the number of subsequent processes, including high temperature processing, that must be performed after formation of the gate structures. There are challenges to implementing such features and processes however. As the gate length and spacing between devices decreases and loading effect vary (e.g., differing pattern densities), these problems are exacerbated. However, problems arise when integrating the gate last process with other fabrication processes such as chemical mechanical polishing (CMP) of the ILD layer to expose the sacrificial gate for removal. For example, during chemical mechanical polishing (CMP) processes, controlling gate height and/or preventing dishing effects (for example, over-polishing) of an inter-layer dielectric layer may present difficulties. Specifically, CMP processes may result in shorter gate heights, power shorts, and/or high sheet resistances (Rs) of resultant devices. Furthermore, it may be difficult to control a gate height for devices in various regions of the substrate having different pattern densities.

Accordingly, what is needed is a method for fabricating an IC device that addresses the above stated issues.

BRIEF DESCRIPTION OF THE DRAWINGS

Aspects of the present disclosure are best understood from the following detailed description when read with the accompanying figures. It is emphasized that, in accordance with the standard practice in the industry, various features are not drawn to scale. In fact, the dimensions of the various features may be arbitrarily increased or reduced for clarity of discussion.

DETAILED DESCRIPTION

It is to be understood that the following disclosure provides many different embodiments, or examples, for implementing different features of the invention. Specific examples of components and arrangements are described below to simplify the present disclosure. These are, of course, merely examples and are not intended to be limiting. Moreover, the formation of a first feature over or on a second feature in the description that follows may include embodiments in which the first and second features are formed in direct contact, and may also include embodiments in which additional features may be formed interposing the first and second features, such that the first and second features may not be in direct contact. Various features may be arbitrarily drawn in different scales for simplicity and clarity. In addition, the present disclosure may repeat reference numerals and/or letters in the various examples. This repetition is for the purpose of simplicity and clarity and does not in itself dictate a relationship between the various embodiments and/or configurations discussed.

With reference to FIGS. 1 through 8, a method 100 and a semiconductor device 200 are collectively described below. The semiconductor device 200 may be an integrated circuit, or portion thereof, that may comprise memory cells and/or logic circuits. The semiconductor device 200 may include passive components such as resistors, capacitors, inductors, and/or fuses; and active components, such as P-channel field effect transistors (PFETs), N-channel field effect transistors (NFETs), metal-oxide-semiconductor field effect transistors (MOSFETs), complementary metal-oxide-semiconductor transistors (CMOSs), high voltage transistors, and/or high frequency transistors; other suitable components; and/or combinations thereof. It is understood that additional steps can be provided before, during, and after the method 100, and some of the steps described below can be replaced or eliminated, for additional embodiments of the method. It is further understood that additional features can be added in the semiconductor device 200, and some of the features described below can be replaced or eliminated, for additional embodiments of the semiconductor device 200.

Figure 1:
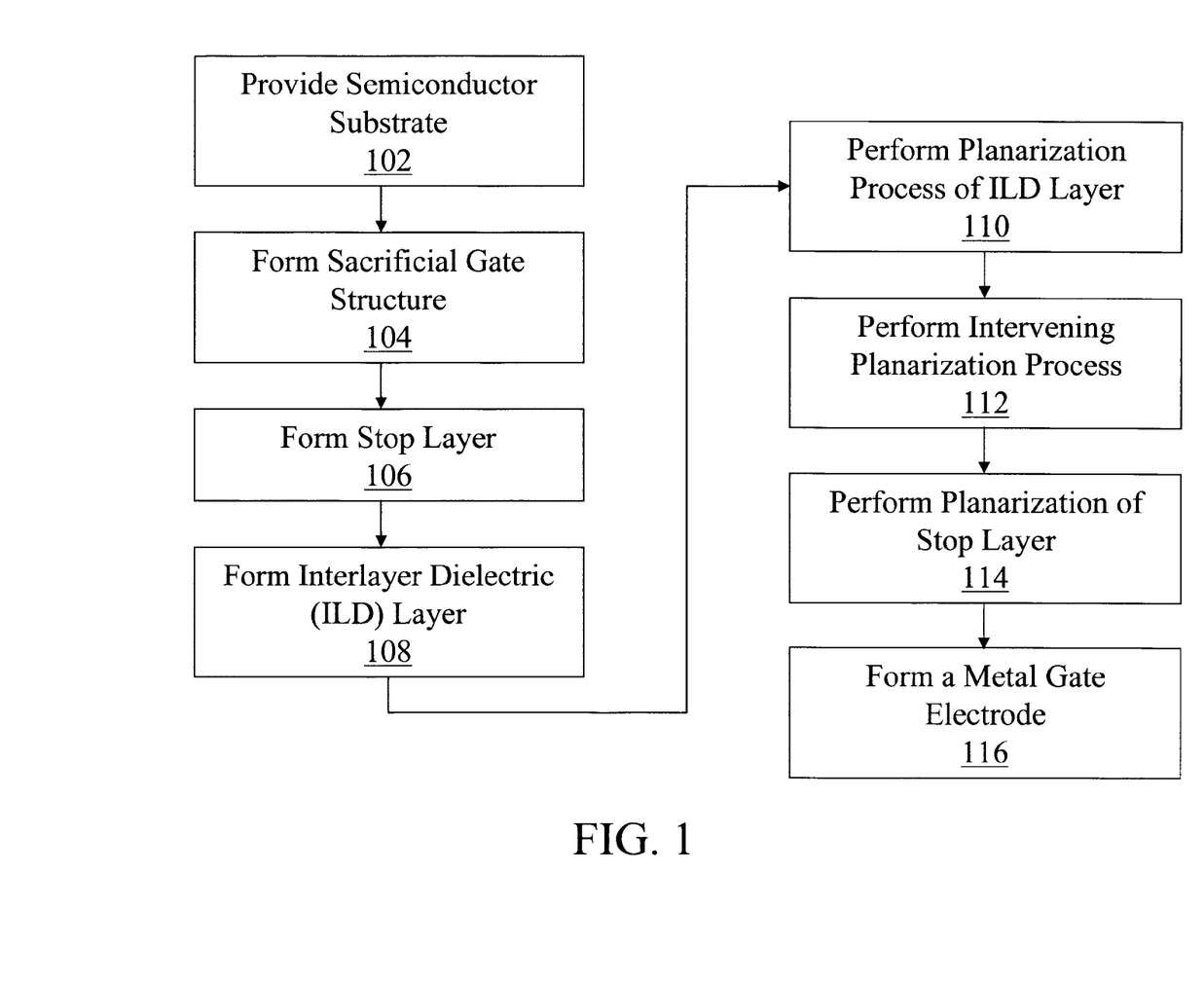
FIG. 1 is a flow chart of a method for fabricating a semiconductor device according to aspects of the present invention.

Illustrated in FIG. 1 is a flow chart of one embodiment of the method 100 for fabricating a semiconductor device according to one or more aspects of the present disclosure. The method 100 includes a "gate last" process. However, one of ordinary skill may recognize benefits of the present disclosure may be provided to other processes, now known or later developed. FIGS. 2-9 are cross-sectional views of a semiconductor device 200 according to one embodiment, during various fabrication stages of the method 100.

Referring now to FIG. 1, the method 100 begins at step 102 where a semiconductor substrate 202 is provided. The semiconductor substrate includes a first region 204 and a second region 206. In an embodiment, the substrate 202 is a semiconductor substrate including silicon. The semiconductor substrate 202 may alternatively or additionally include an elementary semiconductor including silicon or germanium in crystal; a compound semiconductor including silicon carbide, gallium arsenic, gallium phosphide, indium phosphide, indium arsenide, and/or indium antimonide; an alloy semiconductor including SiGe, GaAsP, AlInAs, AlGaAs, GaInAs, GaInP, and/or GaInAsP; or combinations thereof. Furthermore, the semiconductor substrate may be a semiconductor on insulator (SOI), include one or more strained regions, include an epitaxial layer, and/or provide other enhancements for performance.

The substrate 202 may include various doping regions depending on design requirements as known in the art (e.g., p-type wells or n-type wells). For example, the doped regions may be doped with p-type dopants (e.g., boron) and/or n-type dopants (e.g., phosphorus, arsenic). Some of the doped regions may be formed directly on the substrate 202, in a P-well structure, in a N-well structure, in a dual-well structure, or using a raised structure. The semiconductor substrate 202 may further include various active regions, such as regions configured for an N-type metal-oxide-semiconductor transistor device (referred to as an NMOS) and regions configured for a P-type metal-oxide-semiconductor transistor device (referred to as a PMOS). It is understood that the semiconductor device 200 may be formed by CMOS technology processing, and thus some processes are not described in detail herein.

One exemplary isolation region 208 is formed on the substrate 202 to isolate various regions of the substrate 202. The isolation region 208 is exemplary only and not intended to be limiting. The isolation region 208 is a shallow trench isolation (STI). In other embodiments, other isolation techniques may be implemented (e.g., local oxidation of silicon (LOCOS)). The isolation region 208 may comprise silicon oxide, silicon nitride, silicon oxynitride, other suitable materials, or combinations thereof. The isolation region 208 may be formed by any suitable process. As one example, the formation of an STI may include a photolithography process, etching a trench in the substrate (for example, by using a dry etching and/or wet etching), and filling the trench (for example, by using a chemical vapor deposition process) with one or more dielectric material. In some embodiments, the filled trench of the isolation region 206 may have a multi-layer structure.

In an embodiment, the substrate 202 includes a first region 204 and a second region 206 that provide for different loading effects (e.g., pattern density and/or feature height) across the substrate 202. The first region 204 may be illustrative of an isolated area (e.g., lower relative pattern density) of the substrate 202. The second region 206 may be illustrated of a dense area (e.g., greater relative pattern density) of the substrate 202. In an embodiment, the isolated area may be a region of the substrate where one or more features are separated from each other by multiple times the minimum design rule. In an embodiment, the dense area may be a region of the substrate where features are separated from each other by minimum or near-minimum design rule spacing. However, any relative comparison of "dense" and "isolated" is within the scope of the present disclosure.

Referring again to FIG. 1, the method 100 then proceeds to block 104 where a sacrificial gate structure (also referred to as a dummy gate structure) is formed on the semiconductor substrate. The dummy gate structures may be formed by any suitable process. The dummy gate structure may include an interfacial layer, a gate dielectric layer, a gate electrode layer, and/or other suitable elements. One or more of the elements (e.g., interfacial layer, gate dielectric layer, gate electrode layer) may be subsequently removed from the substrate (i.e., be sacrificial layers). One or more of the elements (e.g., interfacial layer, gate dielectric layer) may be included in the resultant semiconductor device. For example, in an embodiment, the method 100 includes a having a gate dielectric is formed underlying a dummy gate electrode where only the dummy gate electrode is subsequently removed.

In an embodiment, one or more sacrificial gate structure layers are formed on the substrate. Then, a layer of photosensitive material (e.g., photoresist) is formed over the sacrificial gate layer(s) by a suitable process, such as spin-on coating, and patterned to form a masking element feature. The pattern of the masking element can then be transferred by an etching process (e.g., dry etch) to the underlying layers (e.g., the gate dielectric layer and the dummy gate electrode layer) to form the gate structures also known as gate stacks. The photoresist layer may be stripped thereafter. In other embodiments, a hard mask layer, antireflective coatings, and/or other suitable materials may also be used. The sacrificial gate structure typically includes polysilicon, though other embodiments are possible. The gate structure may also include a gate dielectric such as, silicon oxide or a high-k dielectric material.

Figure 2:
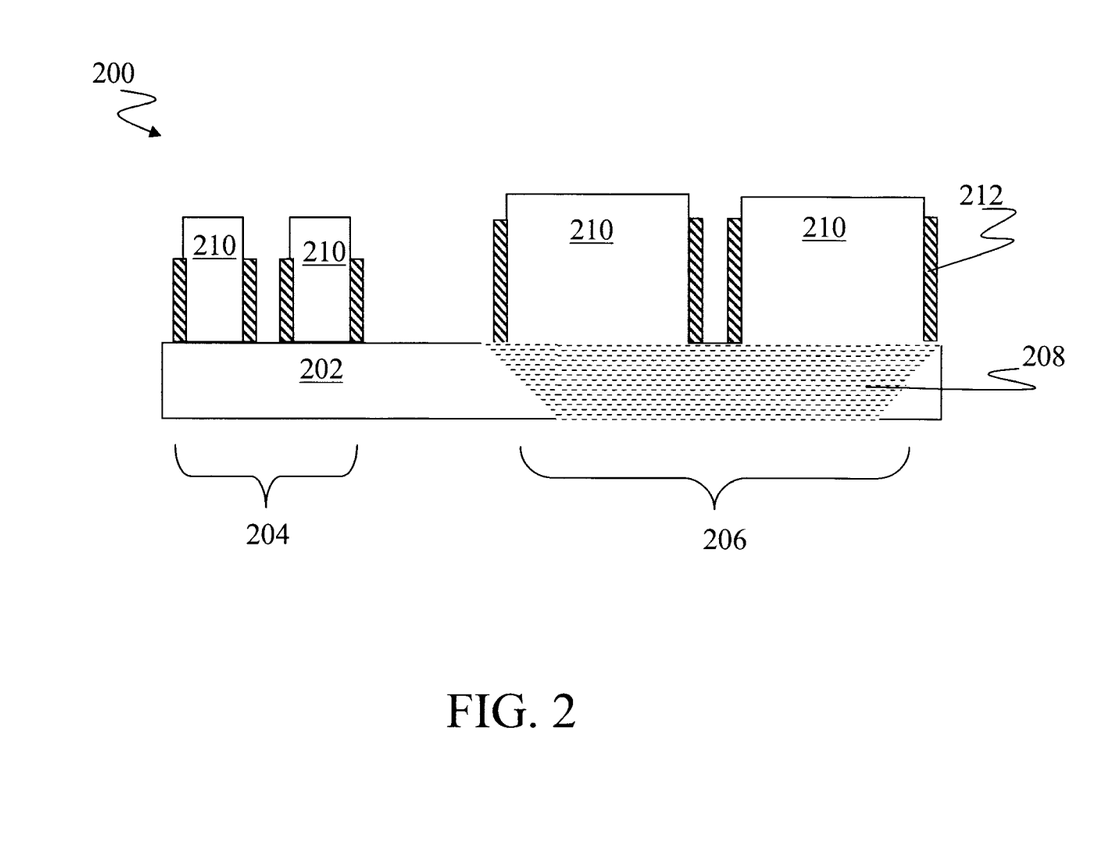
FIGS. 2, 3, 4, 5, 6, 7, and 8 are various cross-sectional views of embodiments of a semiconductor device during various fabrication stages according to the method of FIG. 1.
Figure 3:
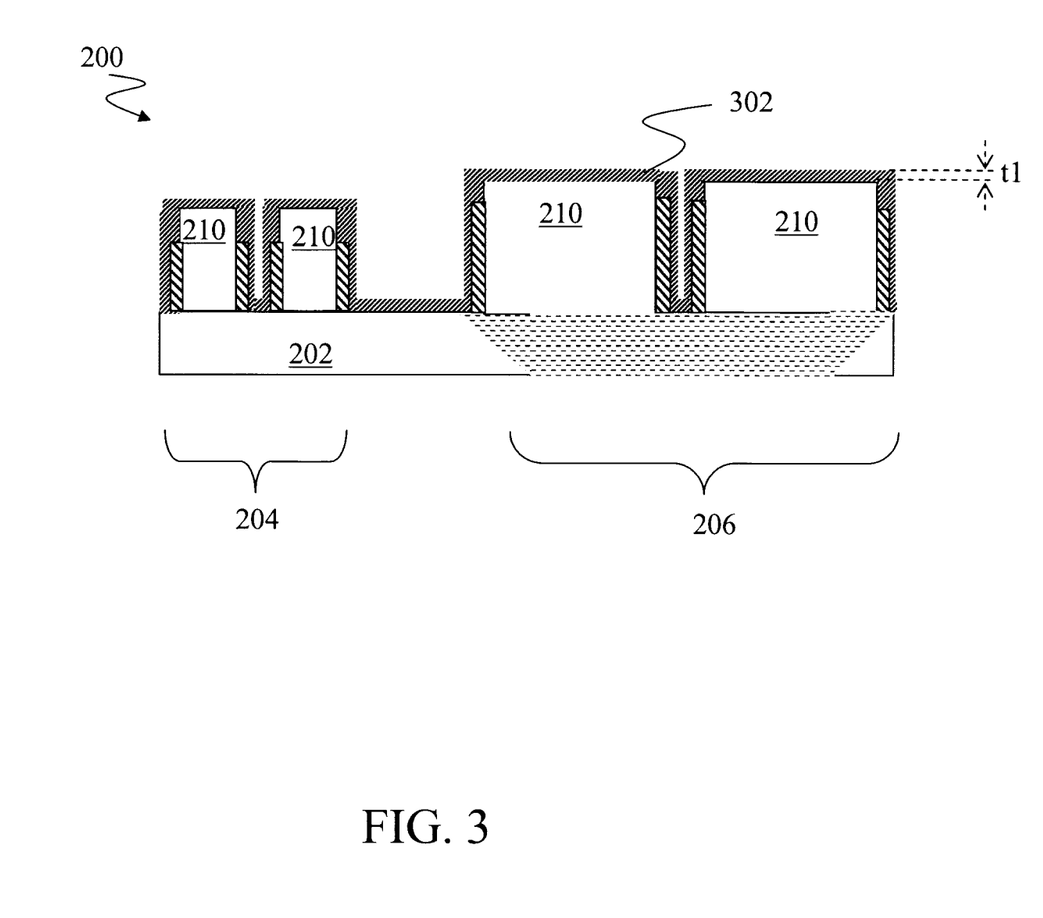

Referring again to the example of FIG. 2, dummy gate structures 210 are formed on the substrate 202. In an embodiment, the dummy gate structures 210 include polycrystalline silicon that will be subsequently removed from the substrate 202, as described in further detail below. It is noted that the dummy gate structures 210 of the region 204 have a different pattern density than the dummy gate structures 210 of the region 206. It is noted that the dummy gate structures 210 of the region 204 may have a different gate height than the dummy gate structures 210 of the region 206. The differences in gate height may be a by-product of fabrication processes and/or on account of the differences in pattern densities between the regions. The gate heights of the dummy gate structures 210 are discussed in further detail below.

Spacers may be further formed on the sidewalls of the dummy gate structures 210. Referring to the example of FIG. 2, spacers 212 are illustrated. The spacers 212 may be formed by any suitable process to any suitable thickness. In an embodiment, the spacers 212 are a multiple layer structure. The spacers 212 may include an oxide material (e.g., silicon oxide), a nitride material (e.g., silicon nitride), silicon carbide, silicon oxynitride, other suitable materials, and/or combinations thereof. The spacers 212 may be used to offset subsequently formed doped regions, such as heavily doped source/drain regions. The spacers 212 may be used to define the walls of a gate region (e.g., the opening provided after the removal of the dummy gate structures 210, as described in further detail below).

Further processing of the semiconductor device 200 may include formation of source/drain regions including lightly doped source/drain regions and heavy doped source/drain regions. The source/drain regions may be formed by implanting p-type or n-type dopants or impurities into the substrate depending on the configuration of the transistors of the semiconductor device 200. Further processing such as formation of contact silicide regions and/or other elements may also be performed.

The method 100 then proceeds to block 106 where a stop layer is formed on the semiconductor substrate. The stop layer may be formed as a conformal coating applied on the semiconductor substrate. The stop layer may be disposed on features such as the sacrificial gate structures, described above with reference to block 104. In embodiments, the stop layer may be a contact etch stop layer (CESL). In an embodiment, the stop layer is silicon nitride. Other exemplary compositions include silicon oxynitride, titanium nitride, and/or other suitable materials. The stop layer may be formed by any suitable process such as, for example, chemical vapor deposition (CVD). The stop layer may be formed having a thickness of between approximately 50 Angstroms and approximately 350 Angstroms, by way of example. Referring to the example of FIG. 3, a stop layer 302 is disposed on the substrate 202. The stop layer 302 may be SiN. The stop layer 302 has a thickness t1 of between approximately 50 Angstroms and approximately 350 Angstroms. The stop layer 302 may be substantially uniform thickness in the first and second regions 204 and 206 of the substrate 202 (e.g., substantially uniform thickness in the isolated and dense regions of the substrate).

Referring again to FIG. 1, the method 100 then proceeds to block 108 where an interlayer dielectric (ILD) layer is formed. The ILD layer may be formed disposed on the stop layer, described above with reference to block 106, and over the gate structures described above with reference to block 104. The ILD layer may be deposited by a high density plasma chemical vapor deposition (HDP-CVD) process and/or other suitable method. In an embodiment, the ILD layer includes silica ($SiO_2$) with phosphorous additive (phosphosilicate glass (PSG)). Other exemplary compositions for the ILD layer include a dielectric material, such as silicon oxide, spin-on glass (SOG), fluorinated silica glass (FSG), carbon doped silicon oxide (e.g., SiCOH), Black Diamond® (Applied Materials of Santa Clara, Calif.), Xerogel, Aerogel, amorphous fluorinated carbon, Parylene, BCB (bis-benzocyclobutenes), Flare, SiLK (Dow Chemical, Midland, Mich.), polyimide, porous polymeric materials, nonporous polymeric materials, and/or combinations thereof. It is understood that the ILD layer may include one or any plurality of layers.

Figure 4:
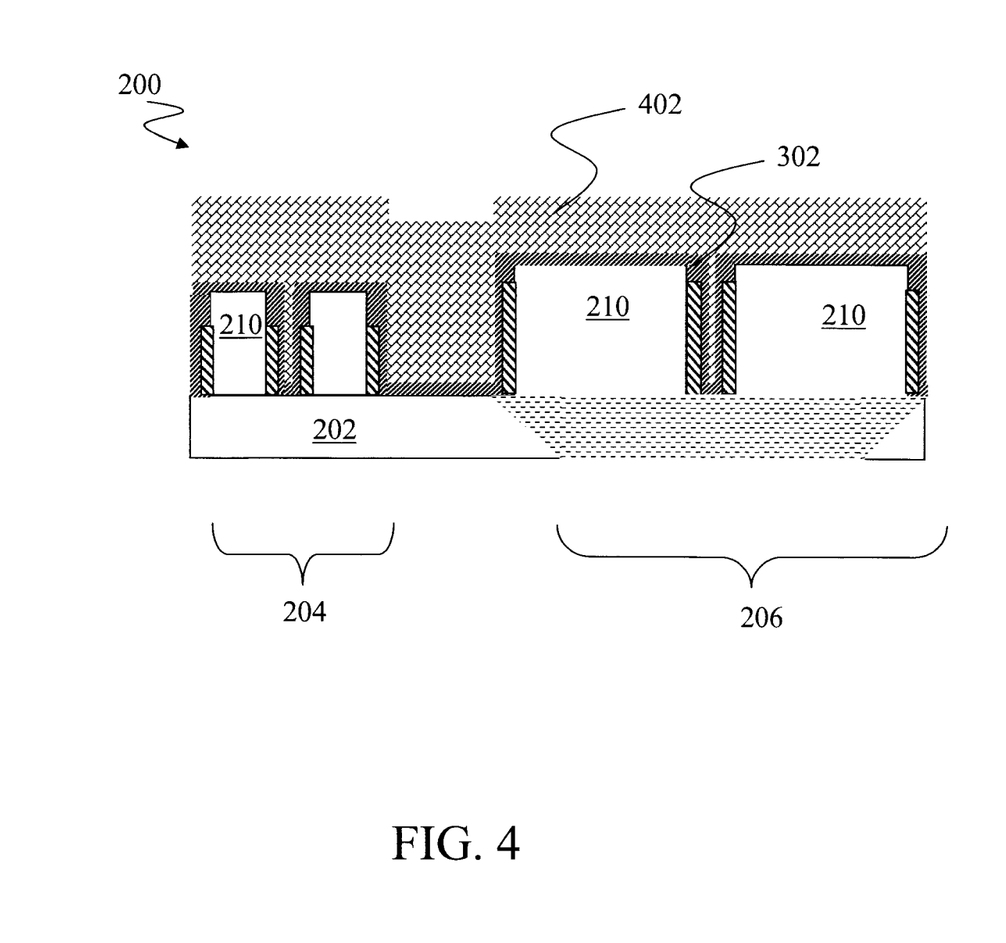

Referring to the example of FIG. 4, an ILD layer 402 is formed on the substrate 202. In an embodiment, the ILD layer 402 is an oxide (e.g., PSG). Due to differences in pattern density of one or more features formed on the substrate 202 (e.g., the gate structures 302), the ILD layer 402 may have a non-planar surface. The ILD layer 402 may have a step height that varies due to the loading effects of the underlying features (e.g., gate structures 210) on the substrate 202. The step height may be impacted by the pattern density, height of features, and/or other variations in feature configuration or dimensions.

Referring again to FIG. 1, the method 100 then proceeds to block 110 where a planarization process is performed on the ILD layer. In an embodiment, the planarization process of block 110 includes a chemical mechanical polish (CMP) process. The planarization process may provide a high selectivity between the material of the ILD layer, described above with reference to block 108, and the material of the stop layer, described above with reference to block 106. For example, the planarization process may include a high oxide to nitride selectivity. In an embodiment, the selectivity of oxide to nitride is approximately 40 to 1. As a further example, the planarization process may provide a high selectivity of PSG to SiN (e.g., removing PSG). Thus, the planarization process is capable of removing ILD material and of providing an end point at the stop layer. The selectivity of the planarization process may be controlled by a suitable polishing solution that is abrasive and/or chemically reactive (e.g., slurry) applied during the polishing process.

The planarization process of block 110 proceeds until a top surface of the stop layer overlying the dummy gate structures is reached or exposed. However, it has been observed that there may be some underpolishing and/or overpolishing due to the difference in pattern structure and density (e.g., of the dummy gate structures). In an embodiment, the planarization process proceeds until the stop layer is reached on one portion of the substrate, while on another portion of the substrate the stop layer has not been reached and residual ILD material remains on the stop layer in that portion of the substrate. Thus, the inventors appreciated that this difference may result in differing gate heights and/or other processing issues.

Figure 5:
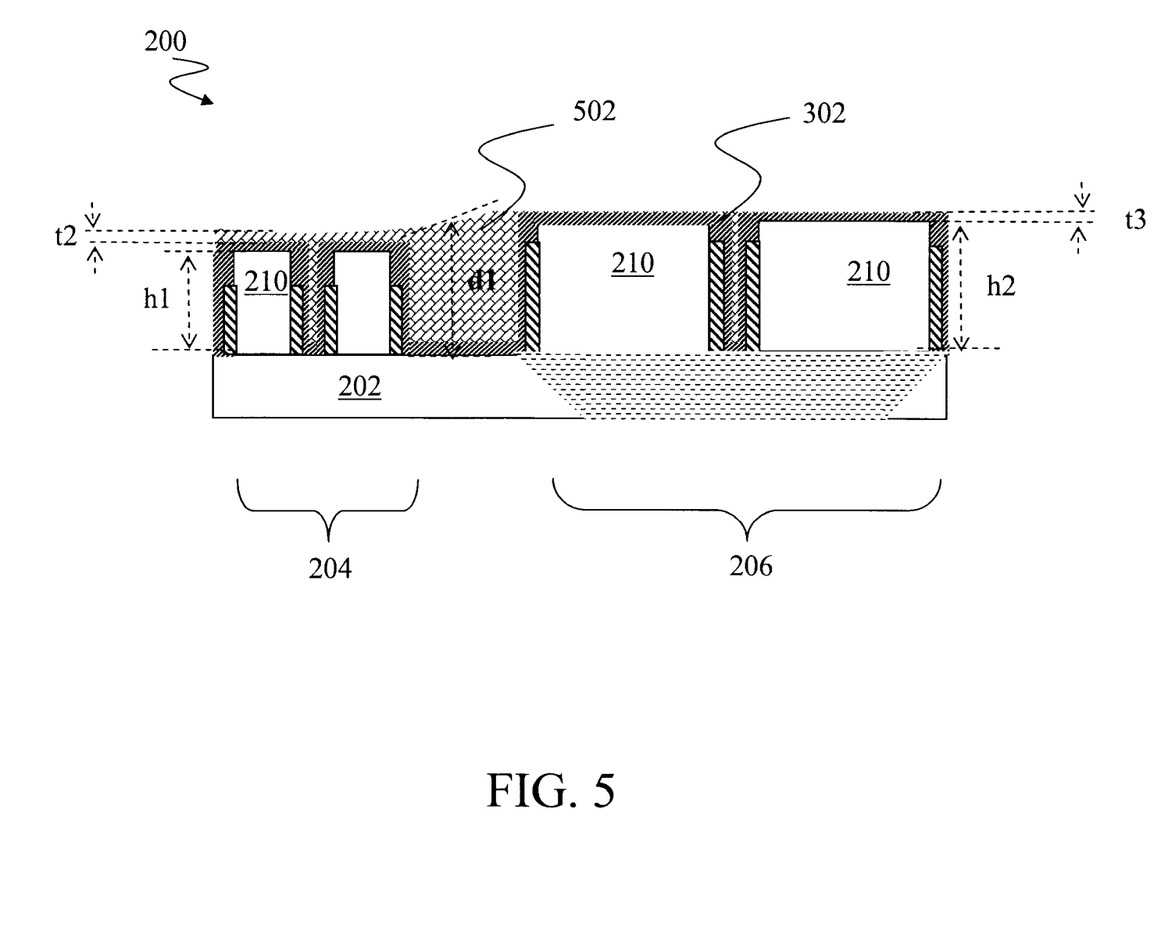

Referring to the example of FIG. 5, the ILD layer 402 has been planarized to form the ILD layer 502. The ILD layer 502 has been removed from the top of the gate structures 210 in the second region 206. For example, the planarization process is stopped at and/or by the stop layer 302. In contrast, the ILD layer 502 remains overlying the gate structures 210 of the first region 204 of the substrate 202. The ILD layer 502 may remain on the first region 204 overlying the gate structures 210 due to the relative (e.g., lower) gate height of the gate structures 210 in the first region 204 as compared to the gate structures 210 of the second region 206. Or in other words, due to the differences in gate height in isolation and dense regions, a portion of the ILD layer will remain on the substrate 202 overlying one or more gate structures. As it is beneficial to remove the ILD layer to access the gate structure for its removal from the substrate, this is undesirable. This is addressed below.

FIG. 5 illustrates that the remaining ILD layer 502 overlying the gate structures 210 in the first region 204 of the substrate 202 has a thickness t2. The thickness t2 may be less than approximately 200 Angstroms. The thickness t3 of the stop layer 302 may be between approximately 50 Angstroms and approximately 350 Angstroms.

As described earlier, the substrate 202 as illustrated includes the first region 204 having one or more isolated features and the second region 206 having one or more dense features (e.g., gate structures 210). It is noted again that the terms "isolated" and "dense" are relative only and not intended to imply any specific pattern density. The gate structures 210 in the first region 204 have a gate height h1 of between approximately 200 Angstroms and approximately 800 Angstroms. The gate structures 210 in the second region 206 have a gate height h2 of between approximately 200 Angstroms and approximately 800 Angstroms. In an embodiment, height h2 is greater than height h1. In an embodiment, the height h2 is at least 10 Angstroms greater than the height h1. The ILD layer 502 has a height d1 interposing the gate structures 210 of the first region 204 and the second region 206. The height d1 may be between approximately 200 Angstroms and approximately 1000 Angstroms.

Referring again to the method 100 of FIG. 1, the method 100 then proceeds to block 112 where a planarization process is performed. In an embodiment, the planarization process includes a CMP process. The planarization process may be described herein as an "intervening CMP process" provided between the processing (e.g., planarization) of the ILD layer, described above with reference to block 110, and the processing (e.g., planarization) of the stop layer, described below with reference to block 114. The planarization process of block 112 may serve to remove a residual portion of the ILD layer overlying gate structures on the semiconductor device. In an embodiment, the planarization process of block 112 removes residual ILD material overlying gate structures having a relatively isolated pattern configuration and density. The planarization process may include a polishing process that an etch selectivity of approximately 1:1 between the material of the ILD layer and the material of the stop layer. For example, in an embodiment, the planarization process of block 112 has an etch selectivity of oxide to nitride of 1:1. The selectivity of the planarization process may be controlled by a suitable polishing solution that is abrasive and/or chemically reactive (e.g., slurry) applied during the polishing process.

The planarization process of block 112 may have a time determined end point. For example, the planarization process may stop after a predetermined amount of time has passed. In an embodiment, the planarization process is approximately 10 seconds. In an embodiment, the planarization process is less than approximately 20 seconds. In an embodiment, the planarization process of block 112 is a time determined end point process and the processes of block 110 and/or 114 are end point determined processes (e.g., stopped on exposure of an underlying layer).

Figure 6:
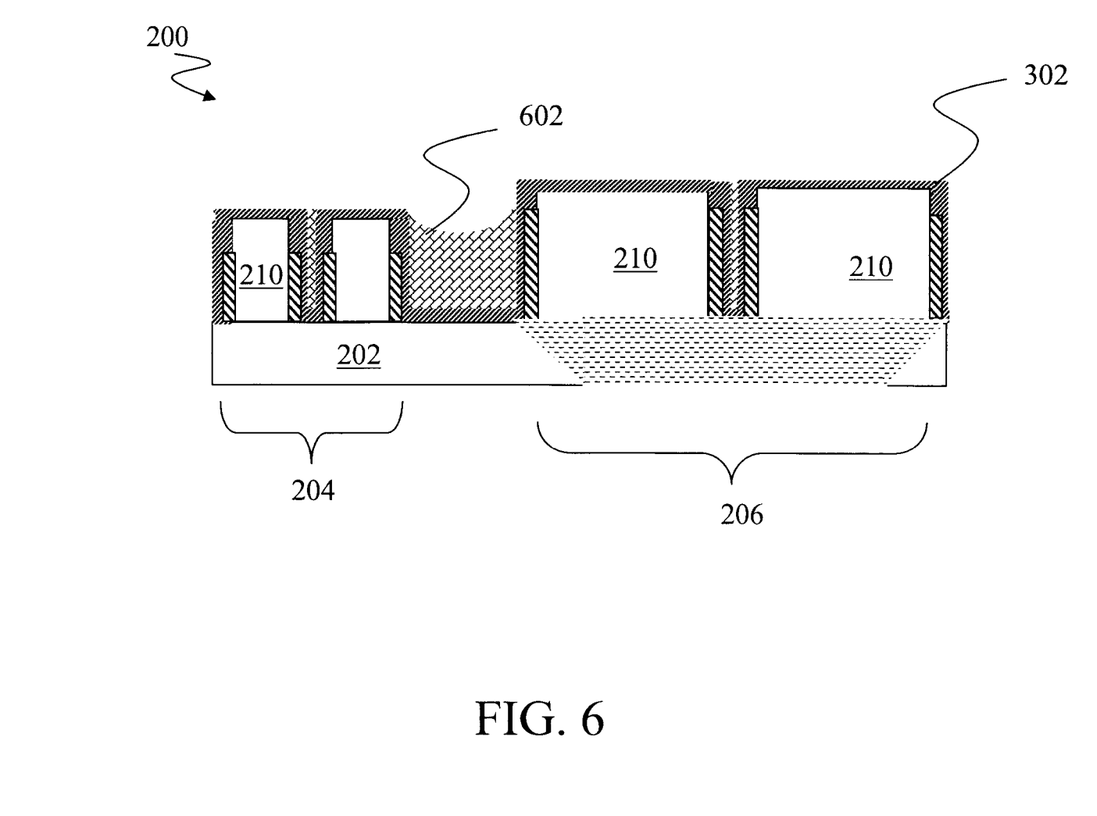

Referring to the example of FIG. 6, illustrated is the ILD layer 602. The ILD layer 602 has been provided by the CMP processing of the ILD layer 502, illustrated in FIG. 5, according to one or more aspects of the block 112 of the method 100. The ILD layer (e.g., residue) has been removed from the top surface of the gate structures 210 in the first region 204 of the substrate 202.

Referring again to FIG. 1, the method 100 then proceeds to block 114 where a planarization process is performed on the stop layer. In an embodiment, the planarization process of block 114 includes a chemical mechanical polish (CMP) process. The planarization process may provide a high selectivity between the material of the stop layer layer, described above with reference to block 106, and the material of the ILD layer, described above with reference to block 108. For example, the planarization process may include a high nitride to oxide selectivity. In an embodiment, the selectivity of nitride to oxide is approximately 2 to 1. As a further example, the planarization process may provide a high selectivity of SiN to PSG (e.g., removing SiN). The planarization process may also be selective to the material of the dummy gate structure (e.g., polysilicon). Thus, the planarization process of block 114 is capable of providing an end point at the top of the dummy gate structure. The selectivity of the planarization process may be controlled by a suitable polishing solution that is abrasive and/or chemically reactive (e.g., slurry) applied during the polishing process.

Figure 7:
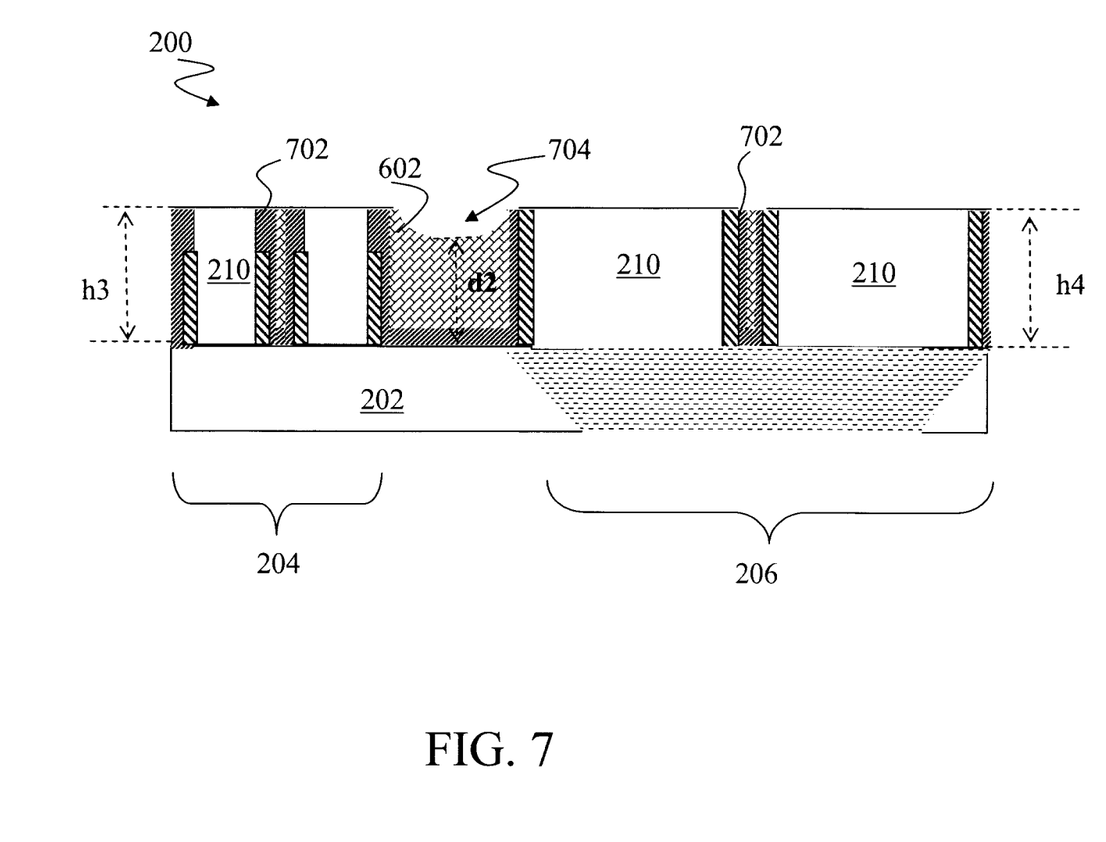

Referring to the example of FIG. 7, the stop layer 302 has been planarized to form the stop layer 702. The stop layer 702 has been removed from the top of the gate structures 210 on the substrate 202 (including the first region 204 and the second region 206).

FIG. 7 illustrates that the height of the sacrificial gate structures 210 in the first region 204 are substantially similar to the height of the sacrificial gate structures 210 in the second region 206 of the substrate 202. The gate structures 210 have a height h3 in the first region 204 and a height h4 in the second region 206. h3 and h4 may be substantially equal. In an embodiment, h3 is less than approximately 600 Angstroms. In an embodiment, h4 is less than approximately 600 Angstroms.

FIG. 7 also illustrates the ILD layer 602 formed between the gate structures 210 has a height d2. The height d2 is between approximately 200 Angstroms and 750 Angstroms. It is also noted that the so-called dishing effect (704) of the ILD layer is reduced according to one or more embodiments of the present disclosure.

The planarization processes (e.g., CMP processes) of blocks 110, 112, and/or 114 may be performed in-situ. For example, a wafer providing the semiconductor device 200 may remain in a single planarization tool during each of the processes. In embodiments, rinses (e.g., de-ionized water) are provided between the planarization processes.

Referring again to FIG. 1, the method 100 then proceeds to block 116 where a metal gate electrode is formed. More particularly, all or a portion of the sacrificial gate structure is removed from the substrate, thereby forming openings (or trenches). The sacrificial gate structure may be removed by suitable wet and/or dry etching processes. Exemplary removal processes include wet etch processes providing an exposure to hydroxide containing solution, deionized water, and/or other suitable etchants. Then, material providing a gate structure (e.g., in the resultant semiconductor device) may be formed within the openings created by the sacrificial gate structure's removal. The material may include material suitable to form interfacial layers, gate dielectric layers, metal gate electrode layers, fill layers, and/or other suitable layers. The material may be formed in the openings using thermal oxidation, physical vapor deposition (PVD), chemical vapor deposition (CVD), plating, and/or other suitable processes. A CMP process may be further applied to remove excess material. Thus, a metal gate structure is formed in the openings.

Figure 8:
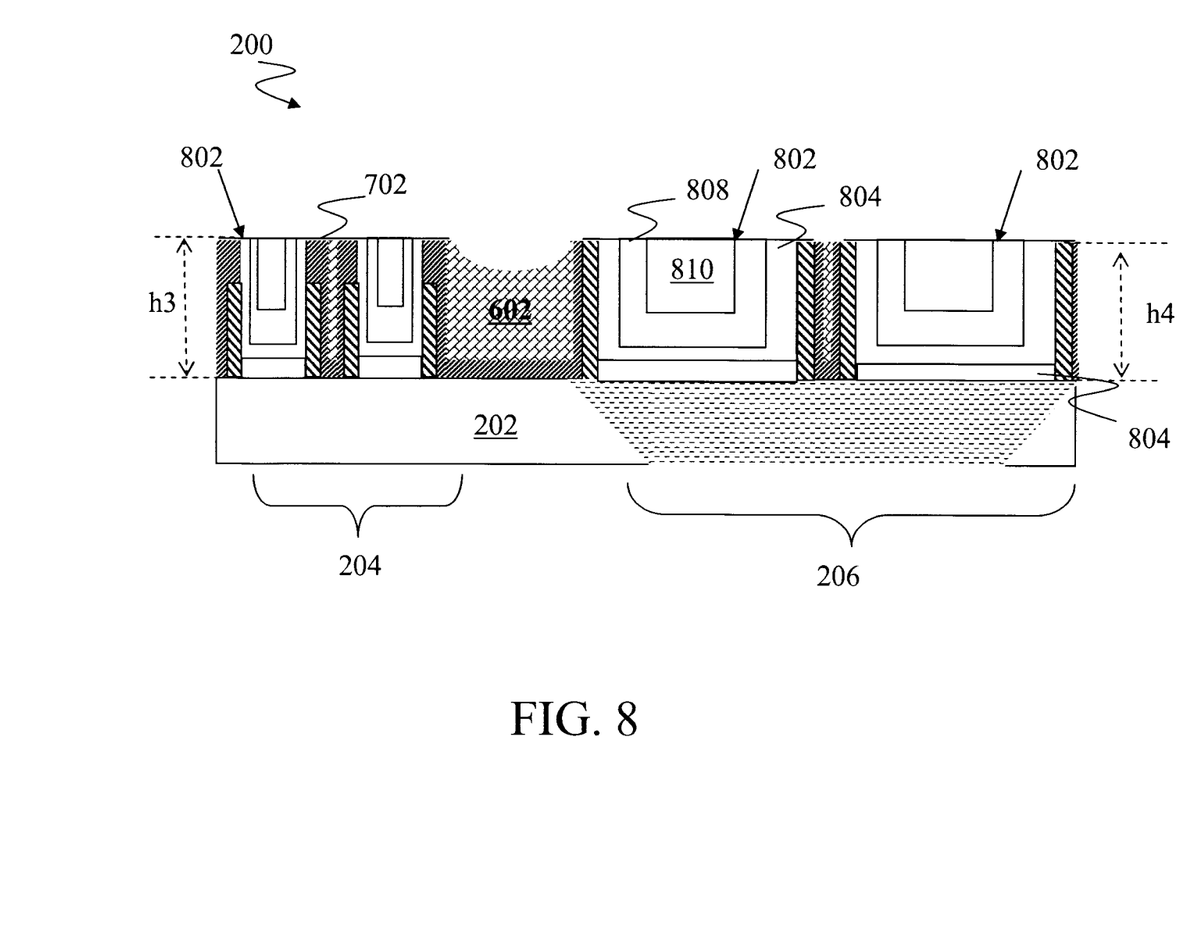

Referring to the example of FIG. 8, a metal gate structure 802 is formed in the opening created by the removal of the sacrificial gate structures 210. The gate structures 802 include an interface layer 804, a gate dielectric layer 806, a work function metal layer 808, and a fill metal layer 810. Various other layers and/or configurations of the metal gate structure 802 are possible and within the scope of the present disclosure. The work function metal layer 808 may include a material suitable for the transistor it is associated with. In embodiments, multiple layers of work function metal may be formed. For an NMOS transistor the work function metal layer 908 may include tantalum, titanium aluminum, titanium aluminum nitride, and/or combinations thereof. The work function metal layer 808 for a PMOS transistor may include titanium nitride, tantalum nitride, or combinations thereof. The fill metal layer 810 may include aluminum, tungsten, and/or other suitable material. The interfacial layer 804 may include a silicon oxide layer ($SiO_2$) or silicon oxynitride (SiON). The gate dielectric layer 806 may be formed on the interfacial layer by atomic layer deposition (ALD) or other suitable technique. The gate dielectric layer 806 may include a high-k dielectric such as hafnium oxide ($HfO_2$). Alternative high-k dielectrics may optionally include $TiO_2$, $HfZrO$, $Ta_2O_3$, $HfSiO_4$, $ZrO_2$, $ZrSiO_2$, combinations thereof, and/or other suitable material. Further, the high-k gate dielectric layer may include a multiple layer configuration such as $HfO_2/SiO_2$ or $HfO_2/SiON$.

FIG. 8 illustrates that the height of the metal gate structures 802 in the first region 204 are substantially similar to the height of the metal gate structures 802 in the second region 206 of the substrate 202. The gate structures 802 have a height h3 in the first region 204 and a height h4 in the second region 206. h3 and h4 may be substantially equal. In an embodiment, h3 is less than approximately 600 Angstroms. In an embodiment, h4 is less than approximately 600 Angstroms.

It is understood that the semiconductor device 200 may undergo further CMOS or MOS technology processing to form various features known in the art. Subsequent processing may form various contacts/vias/lines and multilayer interconnect features (e.g., metal layers and interlayer dielectrics) on the substrate 202, configured to connect the various features or structures of the semiconductor device 200. The additional features may provide electrical interconnection to the device including the formed metal gate structures. For example, a multilayer interconnection includes vertical interconnects, such as conventional vias or contacts, and horizontal interconnects, such as conductive (e.g., metal) lines. The various interconnection features may implement various conductive materials including copper, tungsten, and/or silicide. In one example a damascene and/or dual damascene process is used to form a copper related multilayer interconnection structure.

Figure 9:
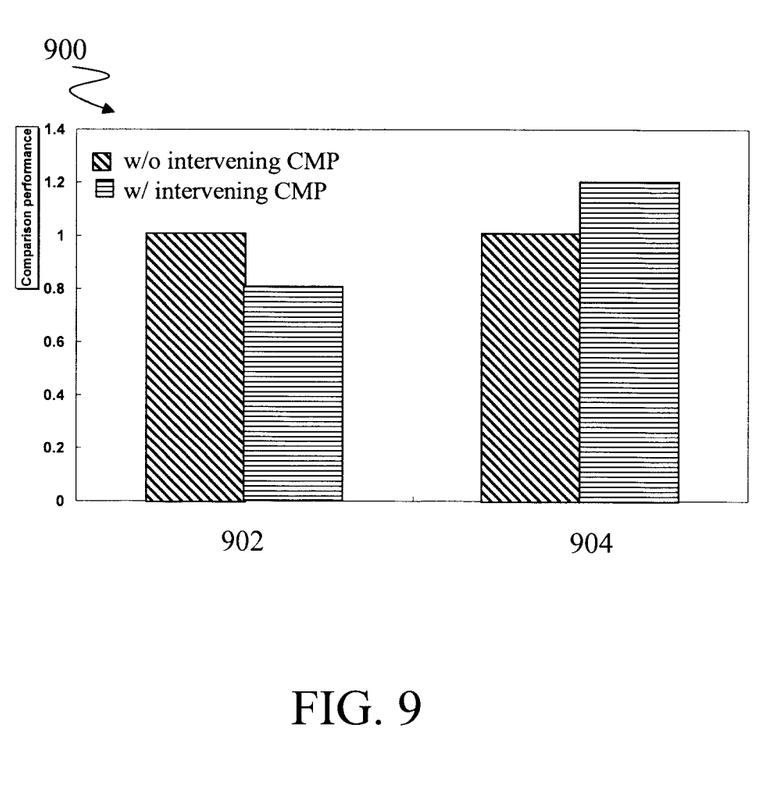
FIG. 9 is a graphical representation of benefits of one or more embodiments of the present disclosure.

Referring now to FIG. 9, illustrated is a graphical representation 900 that illustrates a comparison of an experimental embodiment including an intervening CMP process, such as described above with reference to block 112 of the method 100, and an embodiment without an intervening CMP process. The comparison 902 illustrates relative dishing of an interlayer dielectric layer (ILD). The comparison 904 illustrates relative gate height. The graphical representation 900 illustrates that with an intervening CMP process the gate height may be improved approximately 20% and the dishing effect may be reduced approximately 20%.

In summary, an additional and intervening planarization process may be implemented to form an integrated circuit device having one or more gate structures. The disclosed method may be easily integrated into conventional integrated circuit processing, particularly in high-k/metal gate device fabrication formed using a "gate last" method. The disclosed embodiments may address problems arising from conventional fabrication of metal gate structures for NMOS and PMOS devices in a gate last process by reducing dishing of interposing dielectric layers and/or gate height differences arising from a conventional process. It is understood that different embodiments may have different advantages, and that no particular advantage is necessarily required of all embodiments. Though described as applicable to a "gate last" methodology and sacrificial gate structures, it would be appreciated that various features and processes may benefit from aspects of the present disclosure including removal of material from other features of a semiconductor device.

Thus, in an embodiment, the present disclosure provides a method of semiconductor fabrication including forming a dielectric layer is formed on and interposing a first feature and a second feature. A first CMP process is performed on the dielectric layer to removing the dielectric layer from a top surface of the first feature to expose an underlying layer and decreasing a thickness of the dielectric layer disposed on a top surface of the second feature such that a portion of the dielectric layer remains disposed on the top surface of the second feature. Thereafter, a second CMP process is performed which removes the dielectric layer remaining on the top surface of the second feature.

In another embodiment, a method includes providing a semiconductor substrate and forming a first sacrificial gate structure and a second sacrificial gate structure on the semiconductor substrate. A stop layer (e.g., etch stop layer) is formed overlying the first and second sacrificial gate structures. A dielectric layer (e.g., ILD) is then formed overlying the stop layer. A first planarization process (e.g., CMP) is performed which removes a first portion of the dielectric layer and exposes the stop layer overlying the first sacrificial gate structure. A second planarization process (e.g., CMP) is then performed to remove a second portion of the dielectric layer and expose the stop layer overlying the second sacrificial gate structure. In a further embodiment, a third planarization process is performed to remove the stop layer from overlying the first and second sacrificial gate structures.

In yet another embodiment, a method is described that includes providing a semiconductor substrate. A first plurality of sacrificial gate structures is formed on a first region of a semiconductor substrate and a second plurality of sacrificial gate structures is formed on a second region of the semiconductor substrate. The first plurality of sacrificial gate structures has a different pattern density (e.g., is an isolated region) than the second plurality of sacrificial gate structures. A stop layer is formed overlying the first and second plurality of sacrificial gate structures. Thereafter, a dielectric layer is formed overlying the stop layer and overlying the first and second plurality of sacrificial gate structures. A first planarization process is then performed that removes the dielectric layer overlying the first plurality of sacrificial gate structures and leaves a residual amount of the dielectric layer overlying the second plurality of sacrificial gate structures. A second planarization process to remove the residual amount of the dielectric layer is performed after the first planarization process. A third planarization process to remove the stop layer overlying the first and the second plurality of sacrificial gate structures is performed after the second planarization process.

The foregoing outlines features of several embodiments so that those skilled in the art may better understand the aspects of the present disclosure. Those skilled in the art should appreciate that they may readily use the present disclosure as a basis for designing or modifying other processes and structures for carrying out the same purposes and/or achieving the same advantages of the embodiments introduced herein. Those skilled in the art should also realize that such equivalent constructions do not depart from the spirit and scope of the present disclosure, and that they may make various changes, substitutions, and alterations herein without departing from the spirit and scope of the present disclosure.

What is claimed is:

1. A method of semiconductor fabrication, comprising:
   forming a first sacrificial gate structure and a second sacrificial gate structure on a semiconductor substrate, wherein the first and second sacrificial gate structures are polysilicon;
   forming a conformal underlying layer including on a first top polysilicon surface of the first sacrificial gate structure and on a second top polysilicon surface of the second sacrificial gate structure;
   forming a dielectric layer on and interposing the first sacrificial gate structure and the second sacrificial gate structure, wherein the dielectric layer is disposed on the underlying layer;
   performing a first chemical mechanical polishing (CMP) process having a first selectivity between oxide and nitride on the dielectric layer, wherein the first CMP process includes:
      removing the dielectric layer from the first top surface of the first sacrificial gate structure to expose the underlying layer on the first top surface; and
      decreasing a thickness of the dielectric layer disposed on the second top surface of the second sacrificial gate structure such that a portion of the dielectric layer remains disposed on the top surface of the second sacrificial gate structure; and
   stopping the first CMP process and performing a second CMP process following the first CMP process, wherein the second CMP process has a second selectivity between oxide and nitride, different than the first selectivity and wherein the second CMP process removes the portion of the dielectric layer remaining on the second top surface of the second sacrificial gate structure-thereby exposing the underlying layer on the second top surface of the second sacrificial gate structure and the first top surface of the first sacrificial gate structure.

2. The method of claim 1, further comprising:
   stopping the second CMP process; and
   performing a third CMP process following the second CMP process, wherein the third CMP process has a third selectivity between nitride and oxide, the third selectivity being different than the first and second selectivities and wherein the third CMP process removes the underlying layer from on the first top surface of the first sacrificial gate structure and from on the second top surface of the second sacrificial gate structure.

3. The method of claim 2, wherein the first, second and third CMP processes are performed in-situ.

4. The method of claim 1, wherein the second CMP process has a time dependent endpoint.

5. The method of claim 1, wherein the first CMP process is stopped at the detection of the underlying layer on the first top surface of the first sacrificial gate structure.

6. A method, comprising:
   providing a semiconductor substrate;
   forming a first sacrificial gate structure and a second sacrificial gate structure on the semiconductor substrate, wherein the first sacrificial gate structure has a first top surface of polysilicon and the second sacrificial gate structure has a second top surface of polysilicon, the first and second top surfaces being substantially co-planar;

forming a stop layer on the first and second top surfaces of polysilicon;

forming a dielectric layer overlying the stop layer;

performing a first planarization process having a first selectivity between the dielectric layer and the stop layer, wherein the first planarization process performs removing a first portion of the dielectric layer, wherein the first planarization process exposes the stop layer on the first top surface of polysilicon and wherein the first planarization process preserves a second portion of the dielectric layer disposed on the second top surface;

performing a second planarization process after the first planarization process, wherein the second planarization process has a second selectivity between the dielectric layer and the stop layer, the second selectivity being different than the first, wherein the second planarization process removes the second portion of the dielectric layer, wherein the second planarization process exposes the stop layer on the second top surface of polysilicon; and performing a third planarization process to remove the stop layer from the semiconductor substrate, wherein the third planarization process has a third selectivity between the dielectric layer and the stop layer, the third selectivity different than the first and second selectivities.

7. The method of claim 6, wherein the stop layer has a first composition and the dielectric layer has a second composition, and wherein the first planarization process has a high selectivity between the first and second compositions.

8. The method of claim 7, wherein the second planarization process has a selectivity of approximately 1:1 between the first and second compositions.

9. The method of claim 7, wherein the first composition is a nitride and the second composition is an oxide.

10. The method of claim 6, further comprising:
removing the first and the second sacrificial gate structures to form a first opening and a second opening; and
forming a first metal gate in the first opening and a second metal gate in the second opening.

11. The method of claim 6, wherein the first planarization process and the second planarization process are performed in a single chemical mechanical polish (CMP) apparatus.

12. A method, comprising:
providing a semiconductor substrate;
forming a first plurality of sacrificial gate structures on a first region of a semiconductor substrate and a second plurality of sacrificial gate structures on a second region of the semiconductor substrate, wherein the first plurality of sacrificial gate structures has a different pattern density than the second plurality of sacrificial gate structures;

forming a stop layer material overlying the first and second plurality of sacrificial gate structures, wherein the stop layer material is formed on a polysilicon portion of the first and second plurality of sacrificial gate structures;

forming a dielectric layer material overlying the stop layer material and overlying the first and second plurality of sacrificial gate structures;

performing a first planarization process removing the dielectric layer material overlying the first plurality of sacrificial gate structures to expose the stop layer on the polysilicon portion of the first plurality of sacrificial gate structures, and the first planarization process provides a residual amount of the dielectric layer material overlying the second plurality of sacrificial gate structures, wherein the first planarization process has a high selectivity between the dielectric layer material and the stop layer material such that the first planarization process removes the dielectric layer material at a faster rate than the stop layer material;

performing a second planarization process to remove the residual amount of the dielectric layer after performing the first planarization process, wherein the second planarization process has a selectivity of approximately one to one between the dielectric layer material and the stop layer material; and after the second planarization process, performing a third planarization process to remove the stop layer material overlying the polysilicon portion of the first and the second plurality of sacrificial gate structures, wherein the third planarization process has a high selectivity between the stop layer material and the dielectric layer material such that the first planarization process removes the stop layer material at a faster rate than the dielectric layer material.

13. The method of claim 12, wherein the stop layer includes nitride and the dielectric layer includes oxide.

14. The method of claim 12, wherein the first and the second plurality of sacrificial gate structures have approximately the same height after the third planarization process.

15. The method of claim 12, wherein the second planarization process has an endpoint determined by a predetermined process time.

16. The method of claim 15, wherein the predetermined process time is less than 20 seconds.

* * * * *